United States Patent
Huang et al.

(10) Patent No.: US 11,410,954 B2
(45) Date of Patent: Aug. 9, 2022

(54) ELECTRONIC PACKAGE, MANUFACTURING METHOD THEREOF AND CONDUCTIVE STRUCTURE

(71) Applicant: SILICONWARE PRECISION INDUSTRIES CO., LTD., Taichung (TW)

(72) Inventors: Yu-Lung Huang, Taichung (TW); Chee-Key Chung, Taichung (TW); Chang-Fu Lin, Taichung (TW); Yuan-Hung Hsu, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 8 days.

(21) Appl. No.: 16/922,169

(22) Filed: Jul. 7, 2020

(65) Prior Publication Data
US 2021/0320076 A1    Oct. 14, 2021

(30) Foreign Application Priority Data
Apr. 14, 2020 (TW) ................. 109112491

(51) Int. Cl.
*H01L 23/00* (2006.01)
(52) U.S. Cl.
CPC .............. *H01L 24/13* (2013.01); *H01L 24/05* (2013.01); *H01L 24/11* (2013.01); *H01L 2224/0401* (2013.01); *H01L 2924/0105* (2013.01); *H01L 2924/01028* (2013.01); *H01L 2924/01029* (2013.01); *H01L 2924/01079* (2013.01); *H01L 2924/3512* (2013.01)

(58) Field of Classification Search
CPC ......... H01L 24/13; H01L 24/05; H01L 24/11; H01L 2924/0105; H01L 2924/01028; H01L 2924/01079; H01L 2924/01029; H01L 2224/0401
See application file for complete search history.

(56) References Cited

U.S. PATENT DOCUMENTS

| | | | |
|---|---|---|---|
| 10,598,874 B2* | 3/2020 | Aoki | H01L 24/81 |
| 11,112,570 B2* | 9/2021 | Aoki | H01L 24/13 |
| 2012/0043672 A1* | 2/2012 | Cho | H01L 23/49822 257/778 |
| 2013/0143364 A1* | 6/2013 | Lin | H01L 24/81 438/121 |
| 2019/0326240 A1* | 10/2019 | Chang | H01L 24/81 |

* cited by examiner

*Primary Examiner* — Douglas W Owens
(74) *Attorney, Agent, or Firm* — Kelly & Kelley, LLP

(57) ABSTRACT

Provided is an electronic package, including a first substrate of a first conductive structure and a second substrate of a second conductive structure, where a first conductive layer, a bump body and a metal auxiliary layer of the first conductive structure are sequentially formed on the first substrate, and a metal pillar, a second conductive layer, a metal layer and a solder layer of the second conductive structure are sequentially formed on the second substrate, such that the solder layer is combined with the bump body and the metal auxiliary layer to stack the first substrate and the second substrate.

16 Claims, 10 Drawing Sheets

ELECTRONIC PACKAGE, MANUFACTURING METHOD THEREOF AND CONDUCTIVE STRUCTURE

CROSS-REFERENCE TO RELATED APPLICATIONS

This application claims priority to Taiwan Application Serial No. 109112491, filed on Apr. 14, 2020. The entirety of the above-mentioned patent application is hereby incorporated by reference herein and made a part of this specification.

BACKGROUND

1. Technical Field

The present disclosure relates to a semiconductor packaging process, and more particularly, to an electronic package, a manufacturing method thereof, and a conductive structure.

2. Description of Related Art

Current flip-chip technologies, due to the numerous advantages they bring in, for example, reducing the areas of the chip packages and shortening the transmission paths for signals, have been widely used in the field of chip packaging, for example, in chip scale package (CSP), direct chip attached (DCA) or multi-chip module (MCM), or three-dimensional (3D) integrated circuit (IC) integration techniques in which multiple dies are stacked.

In a flip-chip packaging process, it is often difficult to form reliable bonds between bumps at the periphery of a die and contacts on a package substrate as the thermal expansion coefficient of the die may vary considerably from the thermal expansion coefficient of a package substrate. As a result, the bumps may easily detach from the package substrate. Moreover, as the density of the integrated circuits increases, thermal stress and warpage are aggravated by the mismatch between the thermal expansion coefficients of the die and the package substrate. This results in lower reliability of the electrical connections between the die and the package substrate and failure of the reliability tests.

In order to overcome the aforementioned drawbacks, a process in which a semiconductor material is adopted as an interposer has been developed. In one of such process, a silicon interposer is added between a package substrate and a die. The material of the silicon interposer is selected to be similar to that of the die to avoid problems arising from mismatch in thermal expansion coefficients. Specifically, a semiconductor package 1 shown in FIG. 1 includes a through silicon interposer (TSI) 10 with a die side 10b, a transfer side 10a opposite to the die side 10b, and a plurality of conductive through-silicon vias (TSVs) 100 connecting the die side 10b and the transfer side 10a. A redistribution layer (RDL) 11 is provided on the die side 10b and electrically bonded to a plurality of narrowly-spaced electrode pads 60 of a semiconductor die 6 via a plurality of solder bumps 61. The solder bumps 61 are encapsulated by an underfill 62. The conductive TSVs 100 are electrically bonded to a plurality of more widely-spaced solder pads 70 of a package substrate 7 through a plurality of conductive elements 17 (e.g., solder bumps). Thereafter, an encapsulant 8 is formed on the package substrate 7 so as to encapsulate the semiconductor die 6 and the TSI 10.

However, when the conductive elements 17 between the TSI 10 and the package substrate 7 in a conventional semiconductor package 1 is reflowed and the encapsulant 8 is immediately formed before the soldering materials have time to react and form intermetallic compounds (IMCs), thermal stress residue produced during the reflowing process will concentrate in these conductive elements 17 and results in continuous reactions of the IMCs. This will result in the continual shrinking of the volumes of the conductive elements 17, creating problems such as voids appearing in the conductive elements 17 (incomplete IMC reaction) and cracks in the conductive elements 17 (such as at places where stress is concentrated as indicated by k in FIG. 1). The cracks may even extend to the circuits and elements to which the conductive elements 17 are connected (e.g., the circuit of the package substrate 7 or the TSVs 100), thereby reducing the reliability of the semiconductor package 1 and the product yield.

In addition, similar problems may also occur in the solder bumps 61 between the die 6 and the RDL 11, resulting in cracks between the solder bumps 61 and the RDL 11 (such as at places where stress is concentrated as indicated by k in FIG. 1). The cracks may even extend to the circuits and elements to which the solder bumps are connected, such as the RDL 11 or the electrode pads 60 of the semiconductor die 6, which lowers the reliability of the semiconductor package 1 and the product yield.

Therefore, there is a need for a solution that addresses the aforementioned shortcomings in the prior art.

SUMMARY

In view of the aforementioned shortcomings of the prior art, the present disclosure provides a conductive structure, which comprises: a first conductive layer; a bump body formed on a partial surface of the first conductive layer; and a metal auxiliary layer formed on at least one of the bump body and the first conductive layer exposed from the bump body.

In the above conductive structure, the first conductive layer is a nickel layer.

In the above conductive structure, the bump body is a copper bump.

In the above conductive structure, the metal auxiliary layer is a gold layer.

The present disclosure further provides an electronic package, which comprises: a first substrate provided with a plurality of first pads; a plurality of the above conductive structures combined onto the first pads via the first conductive layer; a second substrate provided with a plurality of second pads; a plurality of second conductive structures formed on the second pads; and a metal pillar, a second conductive layer, a metal layer, and a solder layer of the second conductive structures sequentially formed on the second pads, the solder layer of the second substrate being combined with the metal auxiliary layer and the bump body of the conductive structures on the first substrate, wherein the first substrate and the second substrate are stacked together.

In the above electronic package, the first pads are copper pads.

In the above electronic package, the metal pillar is a copper pillar.

In the above electronic package, the second conductive layer is a nickel layer.

In the above electronic package, the metal layer is a copper layer.

In the above electronic package, a ratio of a sum of a volume of the bump body and a volume of the metal layer to a volume of the solder layer may be 1:1.6~2.1.

In the above electronic package, the bump body and the metal layer are not in contact with each other. For example, a distance between the bump body and the metal layer is at most 12 μm.

The present disclosure further provides a method for manufacturing an electronic package, which comprises: providing the above electronic package; reflowing the solder layer to form an enhanced body from the solder layer, the bump body and the metal layer; and forming a third conductive structure from the enhanced body, the first conductive layer, the second conductive layer and the metal pillar.

In the manufacturing method above, the enhanced body comprises a first compound that is in contact with the first conductive layer and a second compound that is in contact with the second conductive layer. For example, the first compound is $Ni_3Sn_4$, and the second compound is $Cu_6Sn_5$ or $Ni_6Sn_5$.

The manufacturing method above further comprises forming an insulating layer between the first substrate and the second substrate to encapsulate the third conductive structure.

Therefore, in the electronic package, manufacturing method thereof and conductive structure of the present disclosure, the arrangement of the bump body allows sufficient copper material to be made available for the IMC reaction, and the arrangement of the metal auxiliary layer increases the adhesion of the solder layer and results in lateral shrinking of the solder material. Thus, compared to the prior art, the IMC has completely reacted after reflowing, which prevents the volume of the third conductive structure from further shrinking. This effectively averts problems such as voids forming in the enhanced body and cracks in the third conductive structure, which in turn improves the reliability of the electronic package and the product yield.

BRIEF DESCRIPTION OF THE DRAWINGS

FIG. 2D' is a cross-sectional schematic diagram of another embodiment of FIG. 2D.

DETAILED DESCRIPTION

Figure 1:
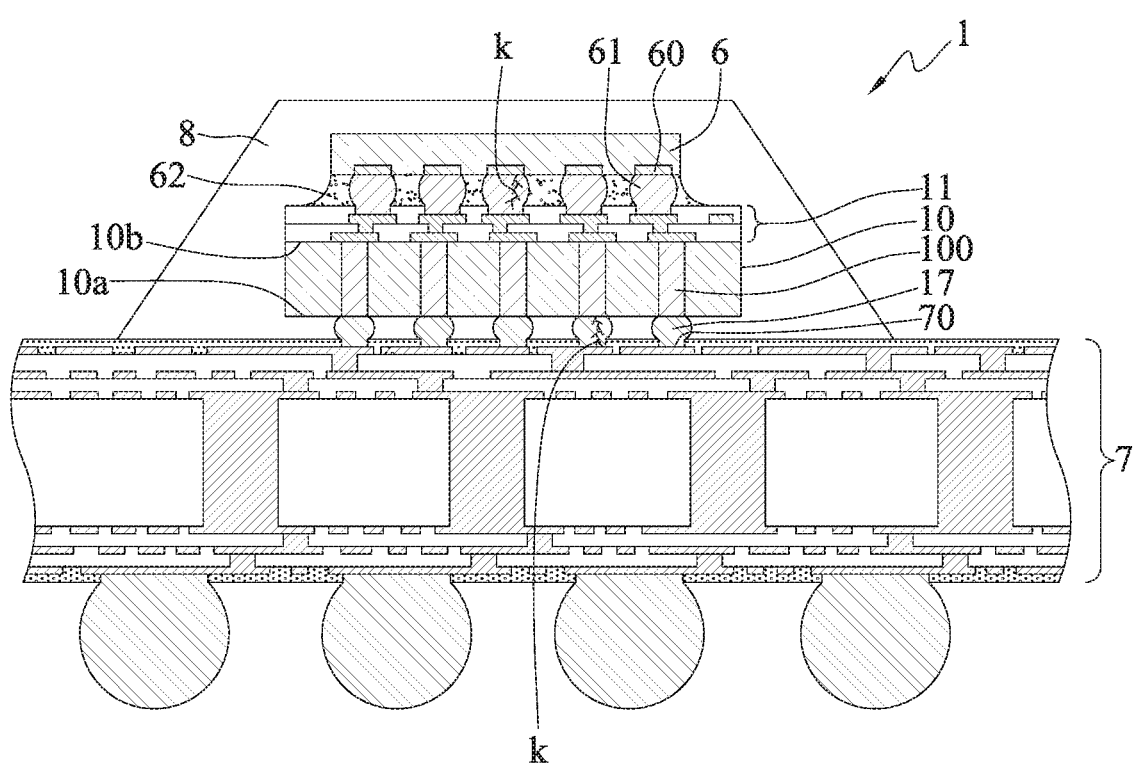
FIG. 1 is a cross-sectional schematic diagram of a conventional semiconductor package.

Implementations of the present disclosure are described below by specific embodiments. Other advantages and technical effects of the present disclosure can be readily understood by one of ordinary skill in the art upon reading the disclosure of this specification.

It should be noted that the structures, ratios, sizes shown in the drawings appended to this specification are provided in conjunction with the disclosure of this specification in order to facilitate understanding by those skilled in the art. They are not meant, in any ways, to limit the implementations of the present disclosure, and therefore have no substantial technical meaning. Without influencing the effects created and objectives achieved by the present disclosure, any modifications, changes or adjustments to the structures, ratios or sizes are construed as fall within the scope covered by the technical contents disclosed herein. Meanwhile, terms such as "first," "second," "above," "below," "one," "a," "an," and the like, are for illustrative purposes only, and are not meant to limit the scope implementable by the present disclosure. Any changes or adjustments made to the relative relationships, without substantially modifying the technical contents, are also to be construed as within the scope implementable by the present disclosure.

FIGS. 2A to 2D are cross-sectional schematic diagrams illustrating a method for manufacturing an electronic package 2 in accordance with the present disclosure.

Figure 2A:
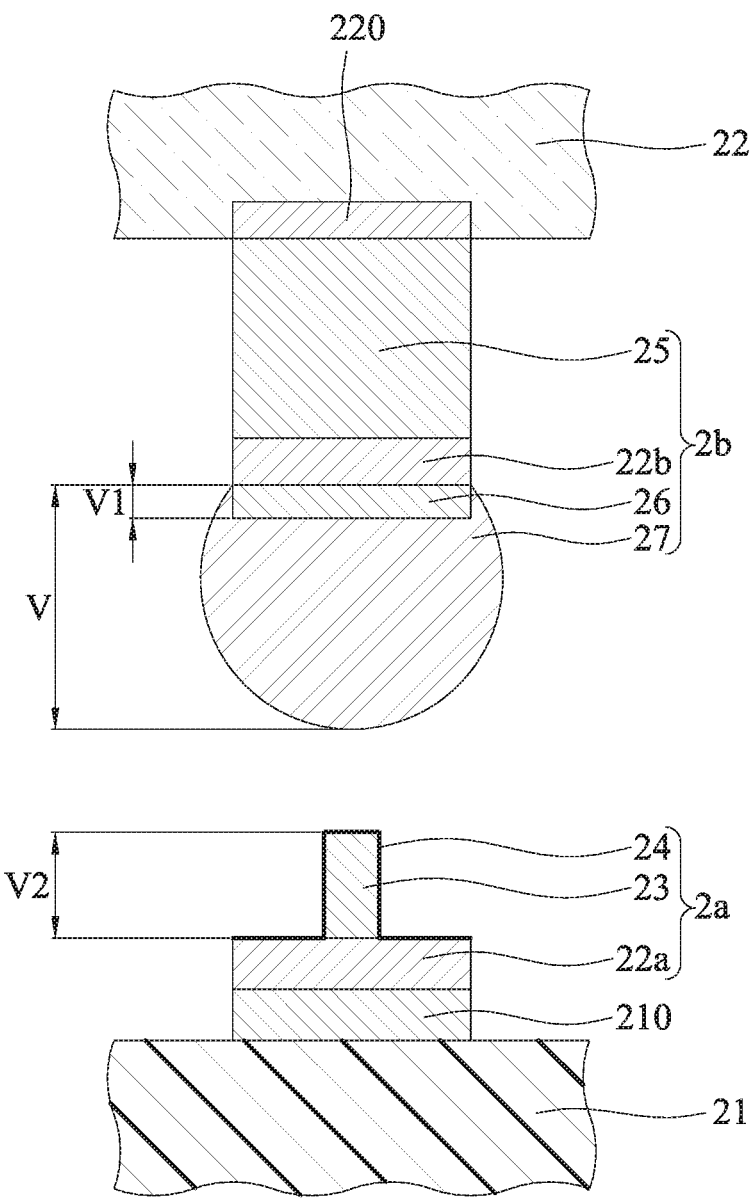
FIGS. 2A to 2D are cross-sectional schematic diagrams illustrating a method for manufacturing an electronic package in accordance with the present disclosure.

As shown in FIG. 2A, a first substrate 21 and a second substrate 22 are provided. The first substrate 21 has at least one first pad 210, and the second substrate 22 has at least one second pad 220.

In an embodiment, the first substrate 21 and the second substrate 22 are substrate structures and/or electronic components. For example, the substrate structure is a package substrate having a core layer and a circuit structure or a coreless circuit structure. The circuit structure includes circuit layers formed on dielectric materials (not shown), such as fan-out redistribution layers (RDLs). The electronic components can be active components, passive components or a combination thereof. The active components can be, for example, semiconductor chips. The passive components can be, for example, resistors, capacitors, and inductors. Specifically, the dielectric material can be, for example, polybenzoxazole (PBO), polyimide (PI), a prepreg (PP), or the like, and the electronic component is a semiconductor chip having an active surface and a non-active surface opposite to the active surface. A plurality of electrode pads (e.g., the first pads 210 or the second pads 220) are provided on the active surface, so the circuit layers (e.g., the first pads 210 or the second pads 220) of the substrate structures are electrically connected in a flip-chip manner through a plurality of first conductive structures 2a and a plurality of second conductive structures 2b. Under bump metallurgy (UBM) (not shown) can be formed between the pads and the conductive structures. It can be appreciated that the substrate structures can also be other carrying units that carries electronics components (e.g., chips), such as lead frames or silicon interposers, but the substrate structures are not limited to those mentioned above.

Furthermore, in an embodiment, a substrate structure is used as the first substrate 21, while an electronic component is used as the second substrate 22. However, in other embodiments, any types of substrates can be used as long as the substrates are stacked together in a flip-chip manner. There are no particular limitations.

Moreover, the first conductive structure 2a includes sequentially forming a first conductive layer 22a, a bump body 23 and a metal auxiliary layer 24 on the first pad 210 (e.g., a copper pad). The first pad 210 is roughly covered by the first conductive layer 22a, and the bump body 23 is only formed on a partial top surface of the first conductive layer 22a. For example, the first conductive layer 22a is a nickel layer, the bump body 23 is a copper bump, and the metal auxiliary layer 24 is a gold layer. Specifically, the bump body 23 can be shaped depending on the needs (such as those shown in FIGS. 3A to 3E), but should not cover the entire top surface of the first conductive layer 22a. The metal auxiliary layer 24 can be formed on the first conductive layer 22a and/or the bump body 23 depending on the needs. For example, the metal auxiliary layer 24 is formed on the entire top surfaces of the first conductive layer 22a and the bump body 23 as shown in FIG. 2A or arranged in various ways as shown in FIGS. 4A to 4E. There are no particular limitations.

In addition, the second conductive structure 2b includes sequentially forming a metal pillar 25, a second conductive layer 22b, a metal layer 26, and a solder layer 27 on the second pad 220 (e.g., a copper electrode pad). For example, the second conductive layer 22b is a nickel layer, the metal pillar 25 is a copper pillar, and the metal layer 26 is a copper layer. Specifically, the second conductive structure 2b conforms to the bump specification for chip flip-chip process, and the metal layer 26 is encapsulated by the solder layer 27.

Figure 2B:
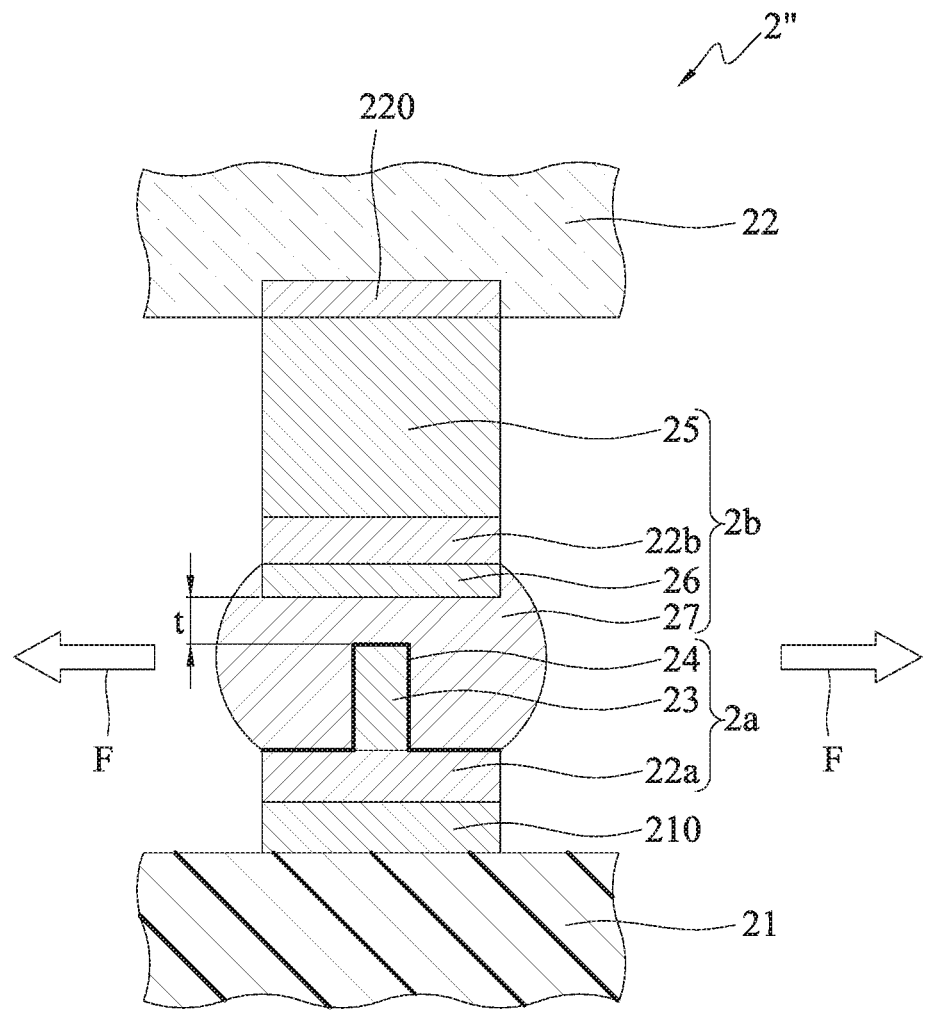

As shown in FIG. 2B, flip-chip connecting process is performed in which the bump body 23 and the metal auxiliary layer 24 are encapsulated by the solder layer 27 of the second conductive structure 2b to form an electronic package 2".

In an embodiment, the solder layer 27 is in contact with the first conductive layer 22a. For example, the solder layer 27 covers the entire first conductive layer 22a.

Furthermore, the ratio of the sum of the volume V2 of the bump body 23 and the volume V1 of the metal layer 26 to the volume V of the solder layer 27 is 1:1.6~2.1 (that is, if the sum of V2+V1 is one unit volume, then V is 1.6 to 2.1 unit volume) as shown in FIG. 2A. This facilitates the complete reaction of subsequent formation of the intermetallic compounds (IMCs).

Also, the bump body 23 and the metal layer 26 are not in contact with each other. For example, the distance t between the bump body 23 and the metal layer 26 is at most 12 μm, and preferably between 5 and 12 μm based on empirical results.

Figure 2C:
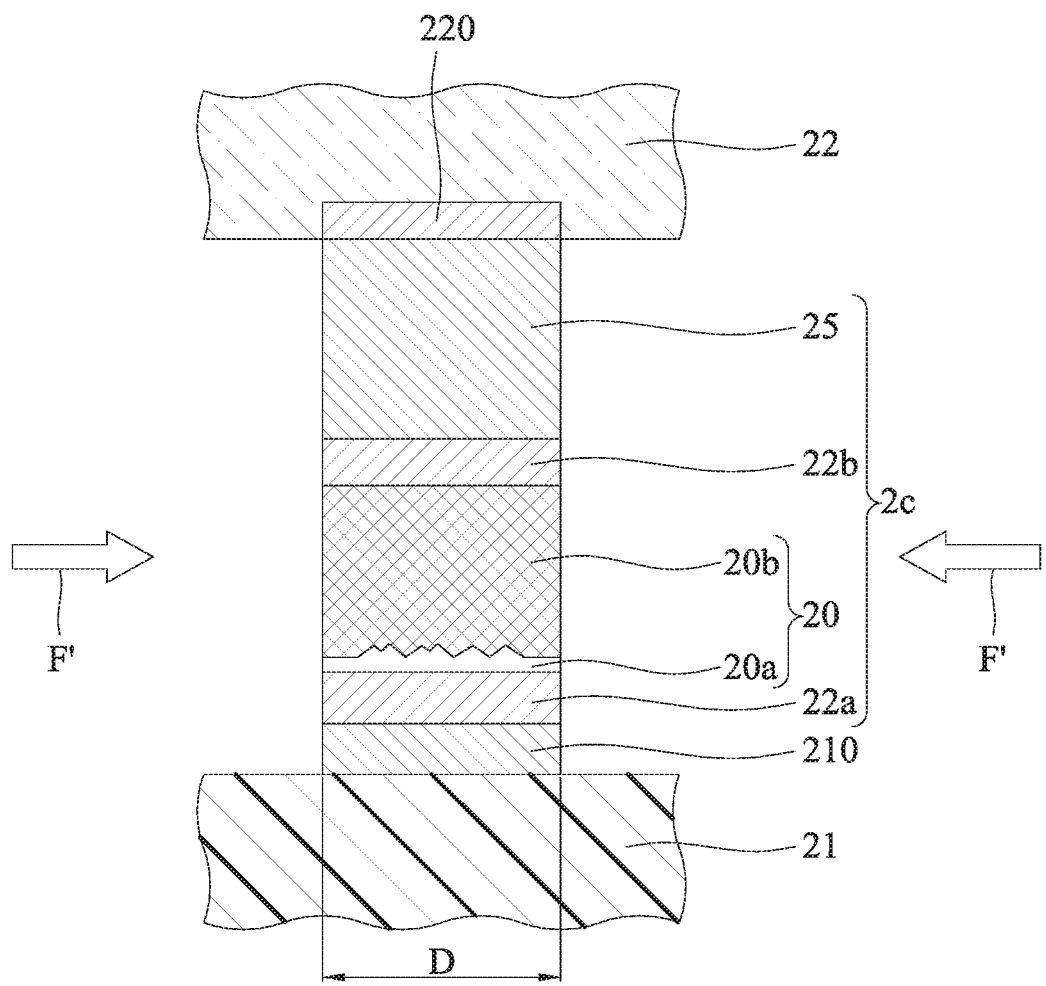

As shown in FIG. 2C, a flip-chip reflowing process is performed to reflow the solder layer 27, such that the solder layer 27 as well as the bump body 23 and the metal layer 26 within the solder layer 27 form an enhanced body 20. The enhanced body 20, the first conductive layer 22a, the second conductive layer 22b, and the metal pillar 25 form a third conductive structure 2c.

In an embodiment, the enhanced body 20 comprises two types of IMCs, wherein one is a first compound 20a in contact with the first conductive layer 22a, and the other is a second compound 20b in contact with the second conductive layer 22b. For example, the first compound 20a is $Ni_3Sn_4$, and the second compound 20b is $Cu_6Sn_5$ or $Ni_6Sn_5$. Specifically, during reflowing process of the solder layer 27, outward expansion (along the acting directions indicated by arrows F shown in FIG. 2B) of the gold material (the metal auxiliary layer 24) causes the copper bump (the bump body 23) to react laterally (along the acting directions indicated by arrows F shown in FIG. 2B) to form an IMC and the solder material (the solder layer 27) to shrink laterally (along the acting directions indicated by arrows F' shown in FIG. 2C), so that the overall width D of the conductive structure 2c after reflowing is uniform, wherein the first pad 210 of the first substrate 21 and the second pad 220 of the second substrate 22 are electrically connected with each other through the third conductive structure 2c.

In addition, after reflowing, the metal auxiliary layer 24 will remain outside of the enhanced body 20 and can be removed by a cleaning fluid.

Figure 2D:
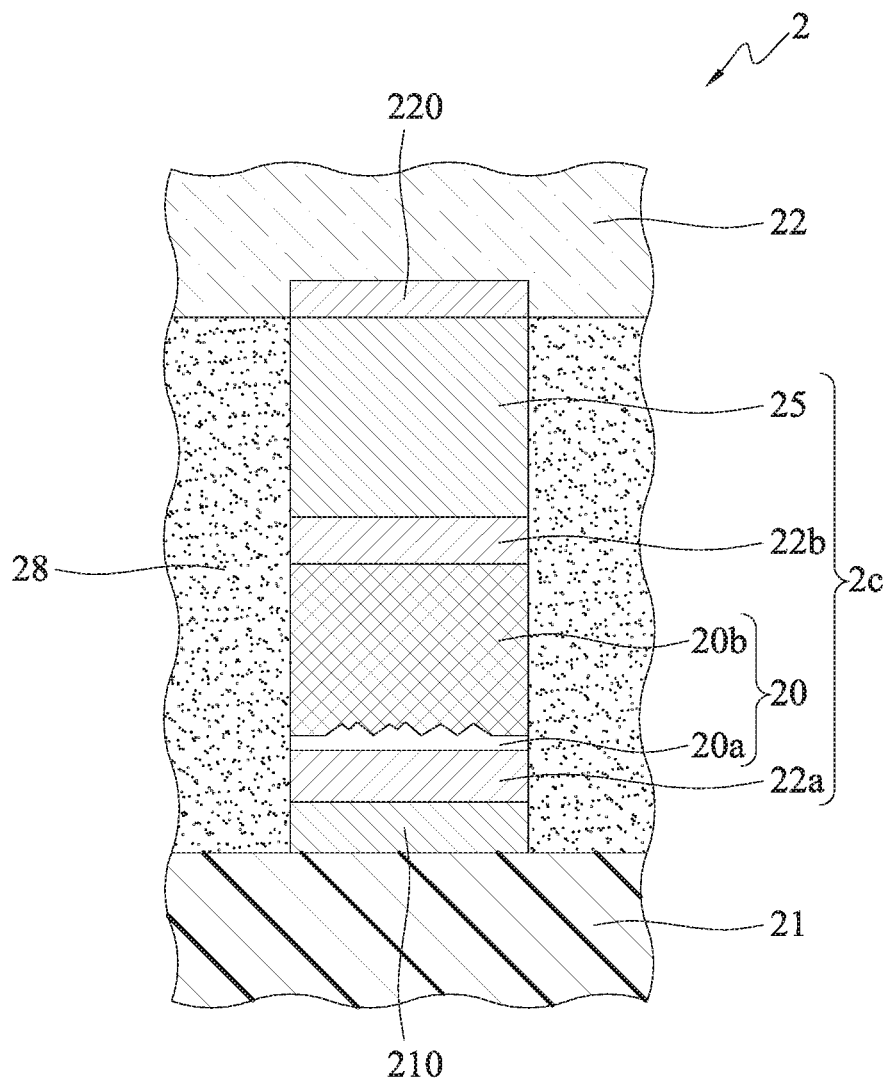
Figure 2D:
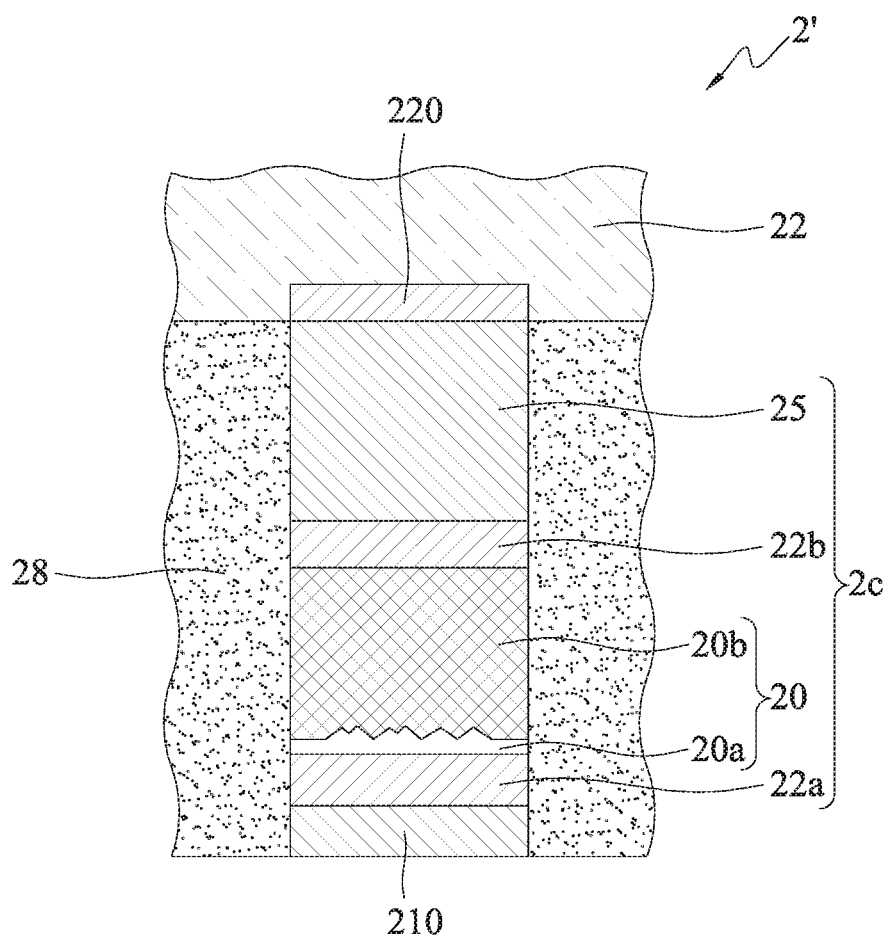
Figure 3A:
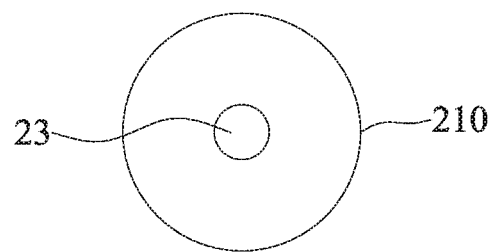
FIGS. 3A to 3E are partial top views of different embodiments of FIG. 2A.
Figure 3B:
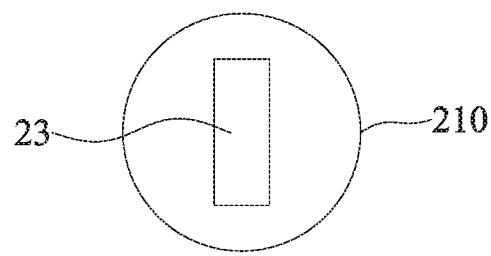
Figure 3C:
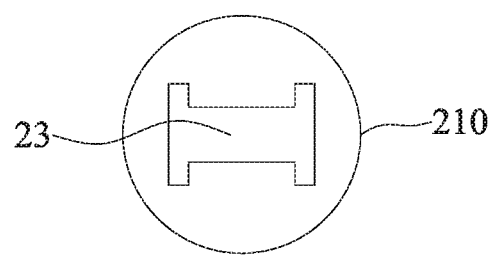
Figure 3D:
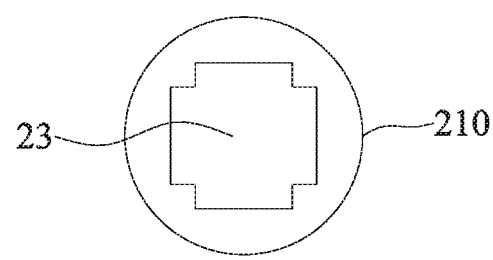
Figure 3E:
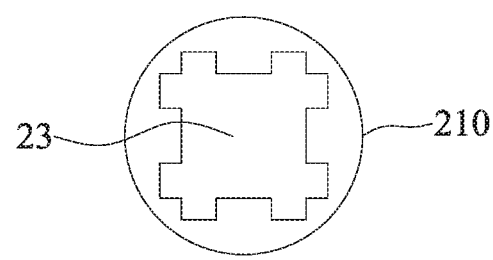
Figure 4A:
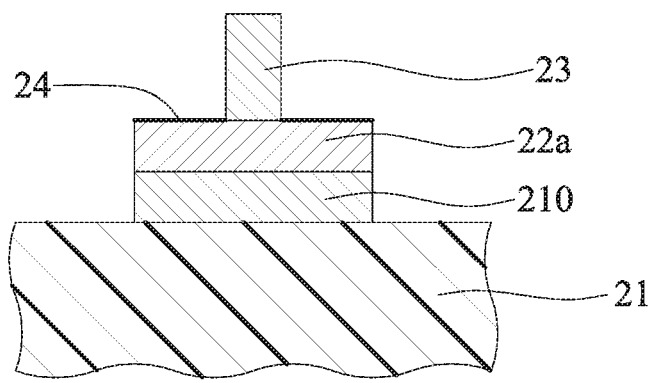
FIGS. 4A to 4C are partial cross-sectional views of different embodiments of FIG. 2A.
Figure 4B:
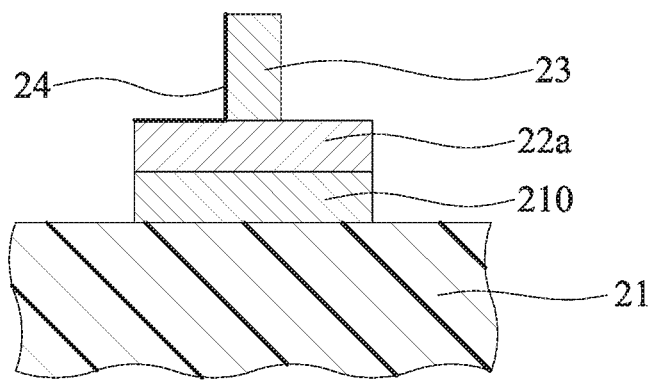
Figure 4C:
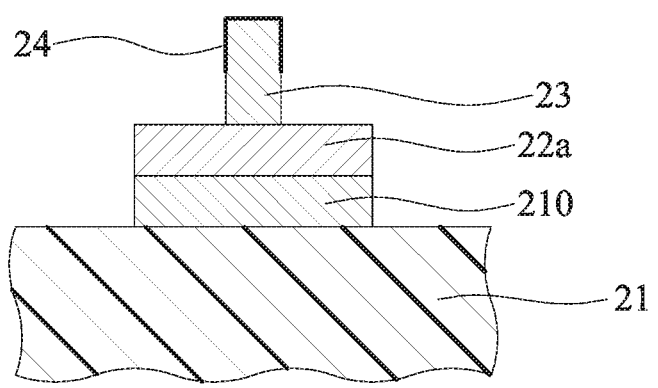
Figure 4D:
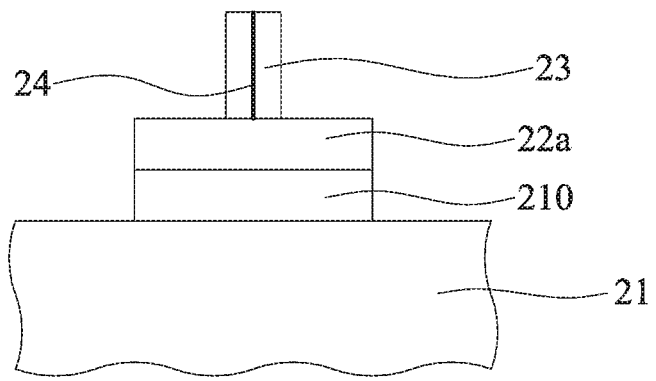
FIGS. 4D to 4E are partial side views of different embodiments of FIG. 2A.
Figure 4E:
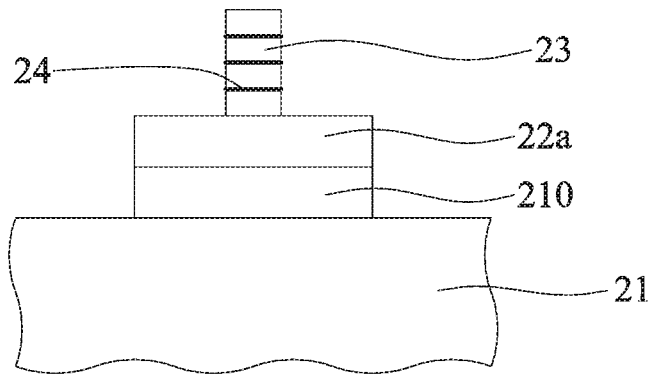

As shown in FIG. 2D, in a subsequent flip-chip packaging process, an insulating layer 28 can be formed between the first substrate 21 and the second substrate 22 to encapsulate the conductive structure 2c, thereby completing the manufacturing of another electronic package 2.

In an embodiment, the insulating layer 28 is an underfill material, polyimide (PI), a dry film, an encapsulant (e.g., an epoxy), a molding compound or any other appropriate material. For example, the insulating layer 28 can be formed by sealant filling, liquid compound sealing, injection, lamination, compression or the like.

Moreover, in other embodiments, depending on the requirements of the packaging specification (e.g., wafer level packaging or chip scale package [CSP]), the first substrate 21 is removed to form an electronic package shown in FIG. 2D'.

Therefore, in the manufacturing method of the present disclosure, the arrangement of the bump body 23 allows sufficient copper material to be made available for the IMC reaction, and the arrangement of the metal auxiliary layer 24 increases the adhesion of the solder layer 27 and causes lateral (along the acting directions indicated by arrows F' shown in FIG. 2C) shrinking of the solder material. Thus, compared to the prior art, when forming the insulating layer 28 in a subsequent process, the IMC has completely reacted, thus preventing the volume of the third conductive structure 2c from further shrinking. This effectively averts problems such as voids forming in the enhanced body 20 and cracks appearing in the third conductive structure 2c or even cracks extending into the circuit (e.g., the first pad 210 or the second pad 220) to which the third conductive structure 2c is connected. As such, the reliability of the electronic package 2 and the product yield are improved.

The present disclosure provides a first conductive structure 2a, which includes: a first conductive layer 22a formed on a first pad 210, a bump body 23 formed only on a partial surface of the first conductive layer 22a, and a metal auxiliary layer 24 formed on the first conductive layer 22a and/or the bump body 23.

In an embodiment, the first pad 210 is a copper pad.

In an embodiment, the first conductive layer 22a is a nickel layer.

In an embodiment, the bump body 23 is a copper bump.

In an embodiment, the metal auxiliary layer 24 is a gold layer.

The present disclosure also provides an electronic package 2", which includes: a first substrate 21 having the first conductive structure 2a, a second substrate 22 having a second pad 220, and a second conductive structure 2b formed on the second pad 220.

The first substrate 21 is provided with a first pad 210 for combining with the first conductive structure 2a.

A metal pillar 25, a second conductive layer 22b, a metal layer 26 and a solder layer 27 of the second conductive structure 2b are sequentially formed on the second pad 220, the solder layer 27 is combined with the bump body 23 and the metal auxiliary layer 24 of the first conductive structure 2a, such that the first substrate 21 and the second substrate 22 are stacked together.

In an embodiment, the metal pillar 25 is a copper pillar.

In an embodiment, the second conductive layer 22b is a nickel layer.

In an embodiment, the metal layer 26 is a copper layer.

In an embodiment, the ratio of the sum of the volume V2 of the bump body 23 and the volume V1 of the metal layer 26 to the volume V of the solder layer 27 is 1:1.6~2.1.

In an embodiment, the bump body 23 and the metal layer 26 are not in contact with each other. For example, the distance t between the bump body 23 and the metal layer 26 is at most 12 μm (i.e. t≤12).

In conclusion, in the electronic package, the manufacturing method thereof, and the first conductive structure of the present disclosure, with the arrangement of the bump body and the metal auxiliary layer, complete reaction of the IMC can be achieved after the solder layer is reflowed. This effectively averts problems such as voids in the enhanced body and cracks in the third conductive structure. Therefore, the first conductive structure of the present disclosure can effectively improve the reliability of the electronic package and the product yield.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A conductive structure, comprising:
   a first conductive layer;
   a bump body formed on a partial surface of the first conductive layer, wherein the bump body has a width less than a width of the first conductive layer;
   a metal auxiliary layer formed on at least one of the bump body and the first conductive layer exposed from the bump body, wherein the metal auxiliary layer is a gold layer; and
   a solder layer combined with the metal auxiliary layer.

2. The conductive structure of claim 1, wherein the first conductive layer is a nickel layer.

3. The conductive structure of claim 1, wherein the bump body is a copper bump.

4. An electronic package, comprising:
   a first substrate provided with a plurality of first pads;
   a plurality of conductive structures combined onto the first pads via a first conductive layer, wherein each of the conductive structures comprises:
   the first conductive layer;
   a bump body formed on a partial surface of the first conductive layer, wherein the bump body has a width less than a width of the first conductive layer; and
   a metal auxiliary layer formed on at least one of the bump body and the first conductive layer exposed from the bump body;
   a second substrate provided with a plurality of second pads;
   a plurality of second conductive structures formed on the second pads; and
   a metal pillar, a second conductive layer, a metal layer, and a solder layer of the second conductive structures sequentially formed on the second pads, the solder layer of the second substrate being combined with the metal auxiliary layer and the bump body of the conductive structures on the first substrate, wherein the first substrate and the second substrate are stacked together.

5. The electronic package of claim 4, wherein the first pads are copper pads.

6. The electronic package of claim 4, wherein the metal pillar is a copper pillar.

7. The electronic package of claim 4, wherein the second conductive layer is a nickel layer.

8. The electronic package of claim 4, wherein the metal layer is a copper layer.

9. The electronic package of claim 4, wherein a ratio of a sum of a volume of the bump body and a volume of the metal layer to a volume of the solder layer is 1:1.6~2.1.

10. The electronic package of claim 4, wherein the bump body and the metal layer are not in contact with each other.

11. The electronic package of claim 10, wherein a distance between the bump body and the metal layer is at most 12 μm.

12. A method for manufacturing an electronic package, comprising:
    providing the electronic package of claim 4;
    reflowing the solder layer to form an enhanced body from the solder layer, the bump body and the metal layer; and
    forming a third conductive structure from the enhanced body, the first conductive layer, the second conductive layer and the metal pillar.

13. The method of claim 12, wherein the enhanced body comprises a first compound that is in contact with the first conductive layer and a second compound that is in contact with the second conductive layer.

14. The method of claim 13, wherein the first compound is $Ni_3Sn_4$.

15. The method of claim 13, wherein the second compound is $Cu_6Sn_5$ or $Ni_6Sn_5$.

16. The method of claim 12, further comprising forming an insulating layer between the first substrate and the second substrate to encapsulate the third conductive structure.

* * * * *